United States Patent
Arai et al.

(10) Patent No.: US 10,984,956 B2
(45) Date of Patent: Apr. 20, 2021

(54) MULTILAYER CERAMIC CAPACITOR, PACKAGE OF MULTILAYER CERAMIC CAPACITOR AND COMPONENT MOUNTING CIRCUIT SUBSTRATE

(71) Applicant: TAIYO YUDEN CO., LTD., Tokyo (JP)

(72) Inventors: Norihiro Arai, Takasaki (JP); Takeshi Nosaki, Takasaki (JP); Jyouji Ariga, Takasaki (JP); Kazuya Maekawa, Takasaki (JP); Manabu Ozawa, Takasaki (JP); Hiroyuki Moteki, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 56 days.

(21) Appl. No.: 16/560,367

(22) Filed: Sep. 4, 2019

(65) Prior Publication Data

US 2020/0082988 A1    Mar. 12, 2020

(30) Foreign Application Priority Data

Sep. 11, 2018    (JP) .............................. JP2018-169419

(51) Int. Cl.
*H01G 4/30*    (2006.01)
*H01G 4/248*    (2006.01)
(Continued)

(52) U.S. Cl.
CPC ............... *H01G 4/30* (2013.01); *H01G 4/232* (2013.01); *H01G 4/248* (2013.01);
(Continued)

(58) Field of Classification Search
CPC .......... H01G 4/30; H01G 4/248; H01G 4/232; H05K 13/0084
See application file for complete search history.

(56) References Cited

U.S. PATENT DOCUMENTS 7,092,236 B2 * 8/2006 Lee .................. H01G 4/232
361/303
8,947,850 B2 * 2/2015 Togashi .................. H01G 2/24
361/301.4
(Continued)

FOREIGN PATENT DOCUMENTS

JP    2014183187 A    9/2014

*Primary Examiner* — Nathan Milakovich
(74) *Attorney, Agent, or Firm* — Law Office of Katsuhiro Arai

(57) ABSTRACT

A ceramic electronic device includes: a multilayer chip having a first and a second internal electrode layers; a first and a second external electrodes covering a first a second regions of a surface of the multilayer chip, wherein: a mark is shifted on a side of one of two end faces on an upper face; the first internal electrode layer is exposed to the first region and connected to the first external electrode; the second internal electrode layer is exposed to the second region and connected to the second external electrode; the second internal electrode is shifted further on a side of the lower face than on a side of the upper face; the second internal electrode layer is shifted further on a side of the lower face than the upper face; the second region is a region of a half of the surface on the lower face side.

7 Claims, 11 Drawing Sheets

(51) Int. Cl.
*H01G 4/232* (2006.01)
*H01G 4/12* (2006.01)
*H05K 13/00* (2006.01)
*H01G 4/012* (2006.01)

(52) U.S. Cl.
CPC ......... *H05K 13/0084* (2013.01); *H01G 4/012* (2013.01); *H01G 4/1236* (2013.01)

(56) References Cited

U.S. PATENT DOCUMENTS 9,502,178 B2 * 11/2016 Fujii ..................... H01G 4/01
9,633,791 B2 * 4/2017 Hattori .................. H01G 4/012
10,304,622 B2 * 5/2019 Shin ..................... H01G 4/30

* cited by examiner

MULTILAYER CERAMIC CAPACITOR, PACKAGE OF MULTILAYER CERAMIC CAPACITOR AND COMPONENT MOUNTING CIRCUIT SUBSTRATE

CROSS-REFERENCE TO RELATED APPLICATION

This application is based upon and claims the benefit of priority of the prior Japanese Patent Application No. 2018-169419, filed on Sep. 11, 2018, the entire contents of which are incorporated herein by reference.

FIELD

A certain aspect of the present invention relates to a multilayer ceramic capacitor, a package of a multilayer ceramic capacitor and a component mounting circuit substrate.

BACKGROUND

Recently, electronic devices achieve multifunction and high frequency. Therefore, low capacity capacitors and low loss capacitors are demanded. The electronic devices are requested to minimize capacity variation and have low ESR and low loss in a high frequency range. The electronic devices are requested to have resistance to noise, since mounting density of components is increased. For the purpose of achieving the demands, it is thought that capacitors have asymmetrical internal structure and directions of mounting of the capacitors are regulated. And so, Japanese Patent Application Publication No. 2014-183187 discloses that capacitors have an asymmetrical internal structure.

SUMMARY OF THE INVENTION

However, in the technology, internal electrode layers to which a voltage is applied are exposed to a surface of a chip. Therefore, high humidity resistance may not be necessarily achieved.

The present invention has a purpose of providing a multilayer ceramic capacitor, a package of a multilayer ceramic capacitor and a component mounting circuit substrate that are capable of achieving high humidity resistance and favorable operation performance.

According to an aspect of the present invention, there is provided a multilayer ceramic capacitor including: a multilayer chip that has a rectangular parallelepiped shape and has two end faces facing with each other, an upper face and a lower face facing with each other, and two side faces facing with each other; a first external electrode that covers a first region of a surface of the multilayer chip; and a second external electrode that covers a second region of the surface of the multilayer chip, the second region being different from the first region, wherein the multilayer chip has a first internal electrode layer and a second internal electrode layer that face with each other and sandwich a dielectric layer of which a main component is ceramic, wherein the multilayer chip has a mark that is shifted on a side of one of the two end faces on the upper face and has a color different from that of the dielectric layer, wherein the first internal electrode layer is exposed to the first region and is connected to the first external electrode, wherein the second internal electrode layer is exposed to the second region and is connected to the second external electrode, wherein the second internal electrode is shifted further on a side of the lower face than on a side of the upper face, wherein the second region is a region of a half of the surface of the multilayer chip on the lower face side, in a facing direction of the upper face and the lower face.

According to another aspect of the present invention, there is provided a package of a multilayer ceramic capacitor including: a plurality of multilayer ceramic capacitors mentioned above; and a carrier tape that has a plurality of housing parts for housing the plurality of multilayer ceramic capacitors, wherein each of the plurality of multilayer ceramic capacitors is housed in each of the plurality of housing parts so that the marks of the plurality of multilayer ceramic capacitor are shifted to one of sides of the each of the housing parts.

According to another aspect of the present invention, there is provided a component mounting circuit substrate including: a substrate having a ground electrode and a signal electrode that are provided on a face thereof; and a multilayer ceramic capacitor mentioned above, wherein the first external electrode is connected to the ground electrode, wherein the second external electrode is connected to the signal electrode.

DETAILED DESCRIPTION

A description will be given of an embodiment with reference to the accompanying drawings.

Figure 1:
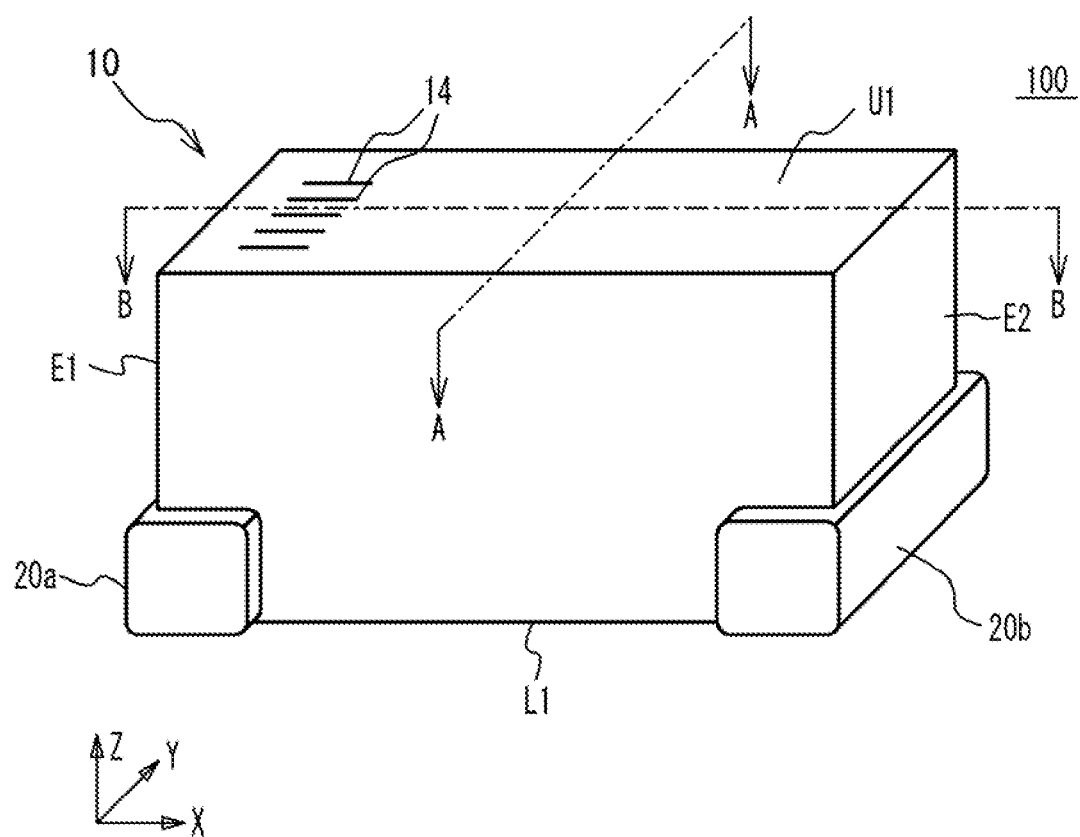
FIG. 1 illustrates an outer perspective view of a multilayer ceramic capacitor.
Figure 2:
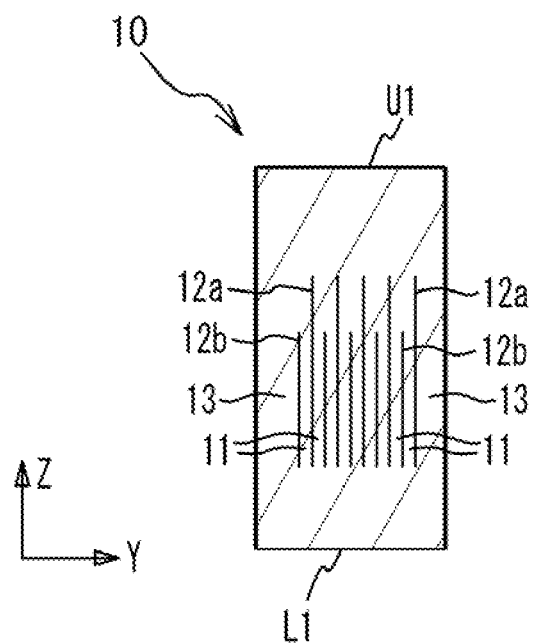
FIG. 2 illustrates a cross sectional view taken along a line A-A of FIG. 1.

FIG. 1 illustrates an outer perspective view of a multilayer ceramic capacitor 100 in accordance with an embodiment. FIG. 2 illustrates a cross sectional view taken along a line A-A of FIG. 1. A description will be given of a structure of the multilayer ceramic capacitor 100 on the basis of FIG. 1 and FIG. 2.

As illustrated in FIG. 1, the multilayer ceramic capacitor 100 includes a multilayer chip 10 having a rectangular parallelepiped shape. The multilayer ceramic capacitor 100 includes a first external electrode 20a and a second external electrode 20b that are respectively provided on two end faces of the multilayer chip 10 facing each other. The end face on the side of the first external electrode 20a is referred to as a first end face E1. The end face on the side of the second external electrode 20b is referred to as a second end face E2. Among four faces other than the two end faces of the multilayer chip 10, a face to which a mark 14 described later is exposed is referred to as an upper face U1. A face facing with the upper face is referred to as a lower face L1. The other two faces are referred to as side faces.

A direction (longitudinal direction of the multilayer chip 10) in which the two end faces of the multilayer chip 10 face with each other is referred to as an X-axis direction. A direction (stacking direction of internal electrode layers described later) in which the two side faces of the multilayer chip 10 face with each other is referred to as a Y-axis direction. A direction in which the upper face U1 and the lower face L1 of the multilayer chip 10 face with each other is referred to as a Z-axis direction. The X-axis direction, the Y-axis direction and the Z-axis direction are vertical to each other.

As an example, on the two end faces of the multilayer chip 10, the first external electrode 20a and the second external electrode 20b are located further on the side of the lower face L1 than a half position of the two end faces in the Z-axis direction. Moreover, the first external electrode 20a and the second external electrode 20b extend to the lower face L1 and the two side faces. However, the first external electrode 20a is spaced from the second external electrode 20b.

As illustrated in FIG. 2, the multilayer chip 10 has a structure designed to have dielectric layers 11 and internal electrode layers alternately stacked. The dielectric layer 11 includes a ceramic material acting as dielectric substance. A main component of the internal electrode layers is a metal. In concrete, one of the dielectric layers 11, a first internal electrode layer 12a, another one of the dielectric layers 11, and a second internal electrode layer 12b are stacked in this order. And, a plurality of the stack units are repeatedly stacked.

In the embodiment, ends of the first internal electrode layers 12a on the side of the lower face L1 of the multilayer chip 10 coincide with ends of the second internal electrode layers 12b on the side of the lower face L1. Alternatively, the first internal electrode layers 12a extend further toward the lower face L1 than the second internal electrode layers 12b extend toward the lower face L1. The first internal electrode layers 12a extend further toward the upper face U1 of the multilayer chip 10 than the second internal electrode layers 12b extend toward the upper face U1. That is, widths of the first internal electrode layers 12a are larger than widths of the second internal electrode layers 12b in the Z-axis direction. It is therefore possible to secure a facing area between each of the first internal electrode layer 12a and each of the second internal electrode layers 12b, even if stacked positions of the first internal electrode layers 12a are shifted to each other in a stacking process described later.

In the multilayer chip 10, cover layers 13 cover an upper face and a lower face of a stacked structure of the first internal electrode layers 12a and the second internal electrode layers 12b. A main component of the cover layers 13 is a ceramic material. For example, a main component material of the cover layers 13 is the same as that of the dielectric layer 11.

Figure 3A:
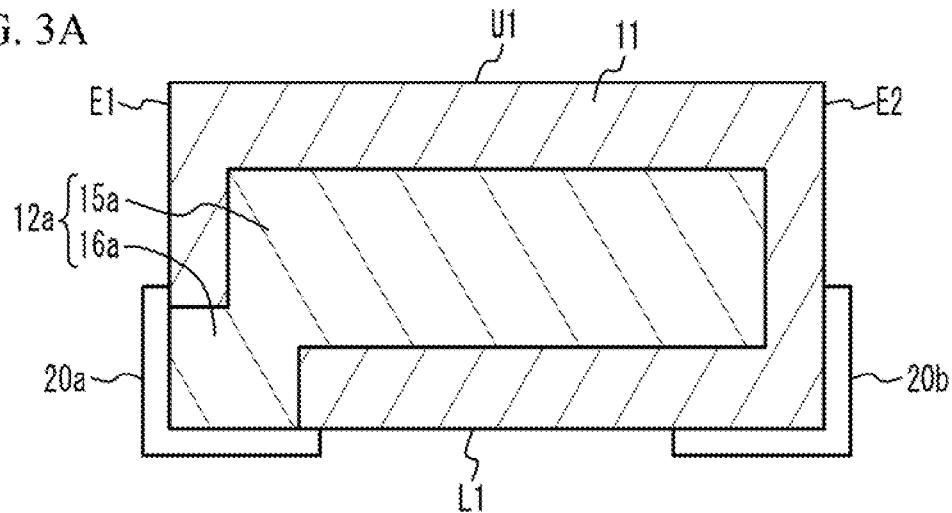
FIG. 3A illustrates a cross sectional view taken along a line B-B of FIG. 1.

FIG. 3A illustrates a cross sectional view taken along a line B-B of FIG. 1. In FIG. 3A, hatching of the first external electrode 20a and the second external electrode 20b is omitted. As illustrated in FIG. 3A, in the multilayer chip 10, the first internal electrode layer 12a is exposed to the first end face E1 further on the side of the lower face L1 than a half position of the first end face E1 in the Z-axis direction and is connected to the first external electrode 20a. The first internal electrode layer 12a is not connected to the second external electrode 20b. For example, in a XZ plane, the first internal electrode layer 12a has a rectangular region 15a exposed to none of the faces of the multilayer chip 10 and an extension region 16a extending to the first end face E1 from the rectangular region 15a. In the example of FIG. 3A, the extension region 16a is also exposed to the lower face L1 of the multilayer chip 10. The first external electrode 20a covers the whole of the exposed region (first region) of the extension region 16a, in the multilayer chip 10.

Figure 3B:
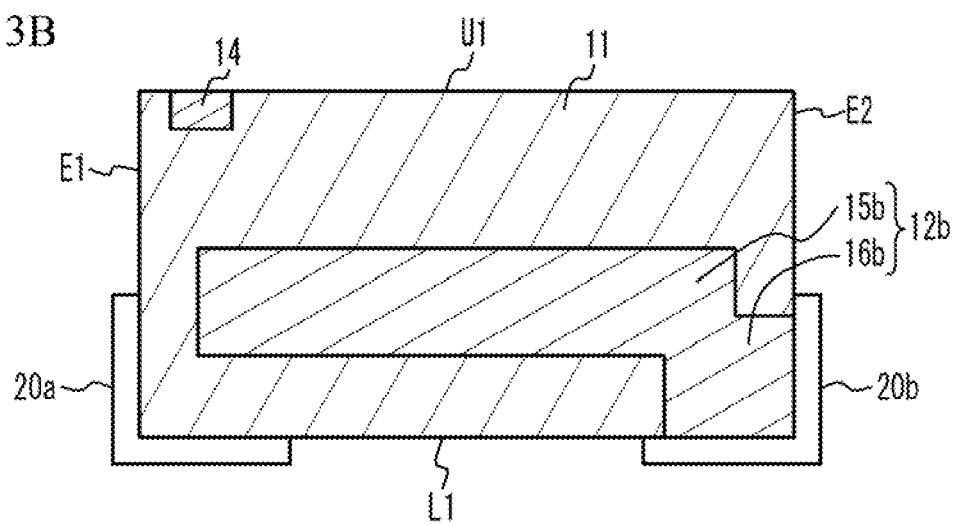
FIG. 3B illustrates a cross sectional view which is taken along a line B-B of FIG. 1 and passes through a second internal electrode layer 12b.

FIG. 3B illustrates a cross sectional view taken along a line B-B of FIG. 1. The cross sectional view passes through the second internal electrode layer 12b. In FIG. 3B, hatching of the first external electrode 20a and the second external electrode 20b is omitted. As illustrated in FIG. 3B, a center of the second internal electrode layer 12b in the Z-axis direction is located further on the side of the lower face L1 than a half position of the multilayer chip 10 in the Z-axis direction. That is, the position of the second internal electrode layer 12b in the Z-axis direction is shifted to the lower face L1 between the upper face U1 and the lower face L1. In the multilayer ceramic capacitor 100 of the embodiment, the position of the second internal electrode layer 12b in the Z-axis direction determines a region for generating electrical capacity (capacity region). Therefore, the capacity region is shifted to the lower face L1 side.

The second internal electrode layer 12b is exposed to the second end face E2 further on the side of the lower face L1 than a half position of the second end face E2 in the Z-axis direction and is connected to the second external electrode 20b. The second internal electrode layer 12b is not connected to the first external electrode 20a. For example, in the XZ plane, the second internal electrode layer 12b has a rectangular region 15b exposed to none of the faces of the multilayer chip 10 and an extension region 16b extending to the second end face E2 from the rectangular region 15b. In the example of the FIG. 3B, the extension region 16b is also exposed to the lower face L1 of the multilayer chip 10. The second external electrode 20b covers the whole of the exposed region (second region) of the extension region 16b, in the multilayer chip 10. The first region does not overlap with the second region.

In this manner, each of the first internal electrode layers 12a and each of the second internal electrode layers 12b are alternately connected to the first external electrode 20a and the second external electrode 20b. Thus, the multilayer ceramic capacitor 100 has a structure in which a plurality of capacitor units are stacked.

In the cross section of FIG. 3B, the mark 14 is provided. The mark 14 is exposed to the upper face U1 further on the side of the first end face E1 than a half position of the upper face U1 in the X-axis direction. That is, the mark 14 is shifted to one of the two end faces, on the upper face U1. The mark 14 is connected to neither the first internal electrode layer 12a nor the second internal electrode layer 12b. Moreover, the mark 14 is connected to neither the first external electrode 20a nor the second external electrode 20b. As illustrated in FIG. 1, the marks 14 are exposed to the upper face U1 on the side of the first end face E1, in a strip shape. Therefore, the marks 14 are arrayed in parallel with each other.

Figure 3C:
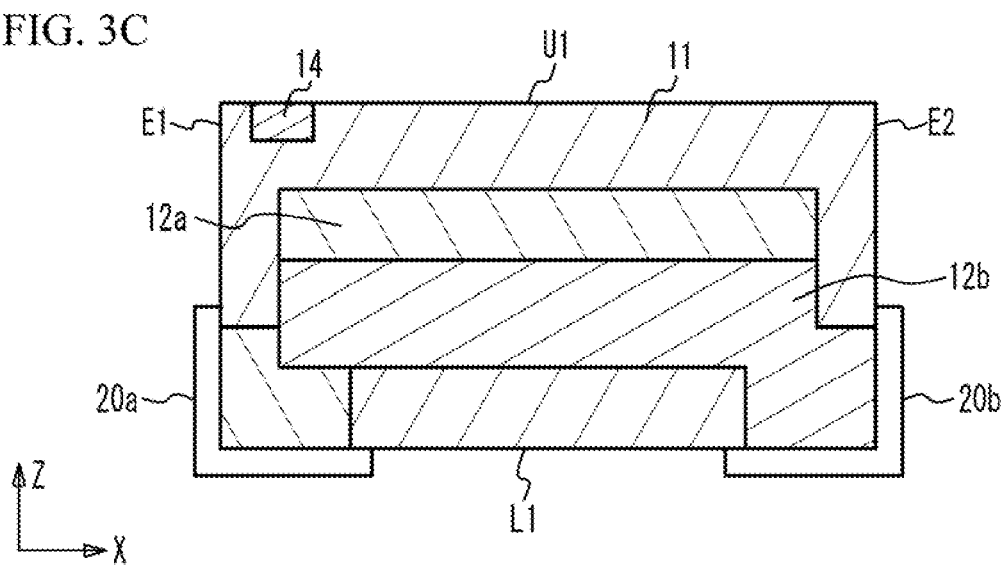
FIG. 3C illustrates a transmitted view of a multilayer chip which is transmitted in a Y-axis direction.

FIG. 3C illustrates a transmitted view of the multilayer chip 10 which is transmitted in the Y-axis direction. As illustrated in FIG. 3C, at least a part of the rectangular region 15a of the first internal electrode layer 12a overlaps with the rectangular region 15b of the second internal electrode layer 12b. The mark 14 is connected to none of the first internal electrode layer 12a, the second internal electrode layer 12b, the first external electrode 20a and the second external electrode 20b.

For example, the multilayer ceramic capacitor 100 may have a length of 0.25 mm, a width of 0.125 mm and a height of 0.125 mm. The multilayer ceramic capacitor 100 may have a length of 0.4 mm, a width of 0.2 mm and a height of 0.2 mm. The multilayer ceramic capacitor 100 may have a length of 0.6 mm, a width of 0.3 mm and a height of 0.3 mm. The multilayer ceramic capacitor 100 may have a length of 1.0 mm, a width of 0.5 mm and a height of 0.5 mm. The multilayer ceramic capacitor 100 may have a length of 3.2 mm, a width of 1.6 mm and a height of 1.6 mm. The multilayer ceramic capacitor 100 may have a length of 4.5 mm, a width of 3.2 mm and a height of 2.5 mm. However, the size of the multilayer ceramic capacitor 100 is not limited.

A main component of the first internal electrode layers 12a and the second internal electrode layers 12b is a base metal such as nickel (Ni), copper (Cu), tin (Sn) or the like. The first internal electrode layers 12a and the second internal electrode layers 12b may be made of a noble metal such as platinum (Pt), palladium (Pd), silver (Ag), gold (Au) or alloy thereof. It is preferable that an element other than an iron group is used for the first internal electrode layers 12a and the second internal electrode layers 12b, from a viewpoint of favorable operation performance in a high frequency range. An average thickness of the first internal electrode layers 12a and the second internal electrode layers 12b is, for example, 3 µm or less.

A main component of the dielectric layers 11 is a ceramic material that is expressed by a general formula $ABO_3$ and has a perovskite structure. The perovskite structure includes $ABO_{3-\alpha}$ having an off-stoichiometric composition. For example, the ceramic material is such as $BaTiO_3$ (barium titanate), $CaZrO_3$ (calcium zirconate), $CaTiO_3$ (calcium titanate), $SrTiO_3$ (strontium titanate), $Ba_{1-x-y}Ca_xSr_yTi_{1-z}Zr_zO_3$ ($0 \leq x \leq 1$, $0 \leq y \leq 1$, $0 \leq z \leq 1$) having a perovskite structure. It is preferable that a paraelectric material such as $CaZrO_3$ is used, from a viewpoint of favorable operation performance in a high frequency range. An average thickness of the dielectric layers 11 is, for example, 20 µm or less.

The mark 14 is not limited if a color of the mark 14 is different from that of the dielectric layers 11. For example, the mark 14 is such as a metal. When a material of the mark 14 is the same as that of the first internal electrode layers 12a and the second internal electrode layers 12b, a pattern of the mark 14 and a pattern of the internal electrode layer are formed in a single printing process. Therefore, the manufacturing process is simplified.

In the multilayer ceramic capacitor 100 of the embodiment, the capacity region is shifted to the lower face L1 side in the Z-axis direction. In the multilayer chip 10, an area where the second internal electrode layers 12b are connected to the second external electrode 20b is further on the side of the lower face L1 than a half position of the multilayer chip 10 in the Z-axis direction. Thus, a distance between a terminal to which the second external electrode 20b is connected and the capacity region of the multilayer ceramic capacitor 100 is small. It is therefore possible to achieve low ESR and low loss in the high frequency range.

The color of the mark 14 is different from the color of the dielectric layers 11. It is therefore possible to recognize the mark 14. Moreover, on the upper face U1, the mark 14 is located further on the side of the first end face E1 than a half position of the upper face U1 in the X-axis direction. That is, the mark 14 is shifted to one of the end faces. Therefore, it is possible to individually recognize the two external electrodes. In this case, it is possible to determine a direction of mounting. It is therefore possible to suppress property variation caused by a direction difference of the mounting. For example, it is possible to easily align mounting directions of small devices, without influence of each property as a capacitor (capacity value, withstand voltage, reliability or the like).

The mark 14 is provided on the upper face U1 and is spaced from the internal electrodes in the Z-axis direction. Therefore, the mark 14 contacts none of the internal electrode layers. On the other hand, the capacity region of the multilayer ceramic capacitor 100 is shifted to the lower face L1 side. It is therefore possible to suppress influence of noise via the mark 14.

In the multilayer chip 10, a region (first region) to which the first internal electrode layers 12a are exposed is covered by the first external electrode 20a. A region (second region) to which the second internal electrode layers 12b are exposed is covered by the second external electrode 20b. It is therefore possible to achieve high humidity resistance.

Accordingly, the multilayer ceramic capacitor 100 in accordance with the embodiment is capable of achieving high humidity resistance and achieving favorable operation performance.

Moreover, in the multilayer chip 10 of the multilayer ceramic capacitor 100 of the embodiment, an area where the first internal electrode layers 12a are connected to the first external electrode 20a is further on the side of the lower face L1 than a half position of the multilayer chip 10 in the Z-axis direction. Thereby, a distance between a terminal to which the first external electrode 20a is connected and the capacity region of the multilayer ceramic capacitor 100 is small. It is therefore possible to achieve lower ESR and lower loss in the high frequency range.

Moreover, the mark 14 acts as a mark for confirmation after mounting of the multilayer ceramic capacitor 100. It is therefore possible to determine quality of mounting of the multilayer ceramic capacitor 100.

Figure 4A:
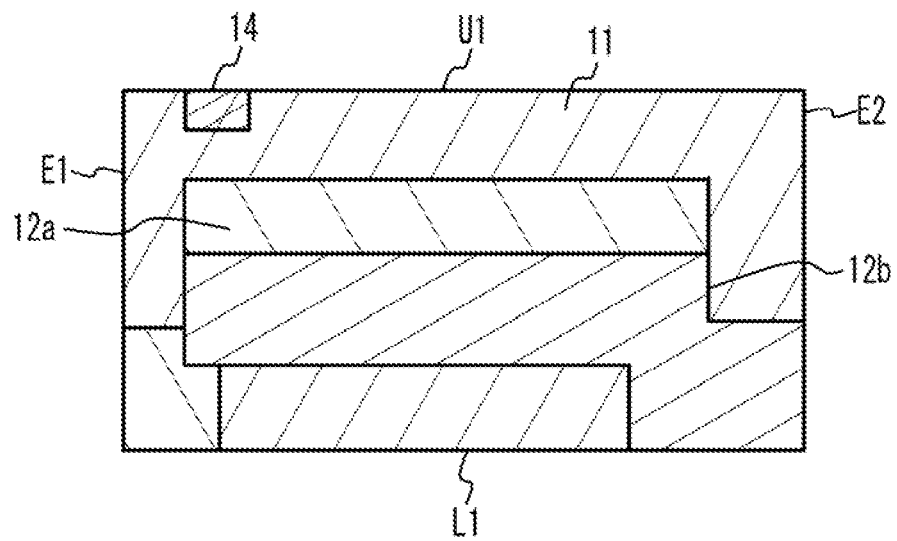
FIG. 4A and FIG. 4B illustrate cases where internal electrode layers are shifted to one of end faces.
Figure 4B:
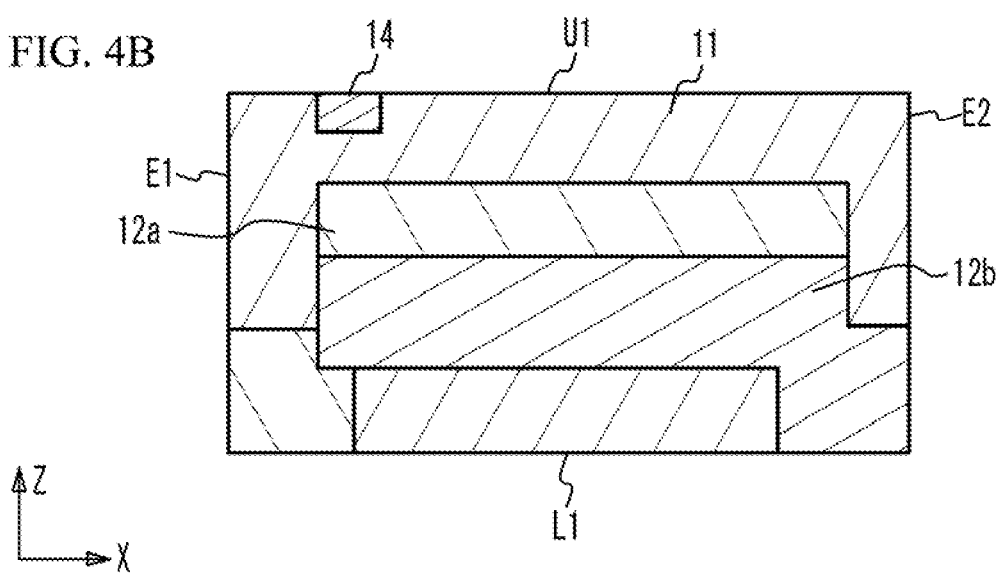

The mark 14 acts as a mark for confirming stacking accuracy (position accuracy) of the first internal electrode layers 12a and the second internal electrode layers 12b. For example, as illustrated in FIG. 4A, it is possible to confirm that the first internal electrode layers 12a and the second internal electrode layers 12b are shifted on the side of the first end face E1. As illustrated in FIG. 4B, it is possible to confirm that the first internal electrode layers 12a and the second internal electrode layers 12b are shifted on the side of the second end face E2. When selection on the basis of the location of the mark is performed, it is possible to select a chip having desired property.

As illustrated in FIG. 3A and FIG. 3B, the mark 14 is provided in a cross section in which the second internal electrode layer 12b is provided but is not provided in a cross section in which the first internal electrode layer 12a is provided. That is, the mark 14 is not provided in a plane formed by the first internal electrode layer 12a but is provided in a plane formed by the second internal electrode layer 12b. An upper end of the second internal electrode layer 12b (upper end on the side of the upper face U1) is located further on the side of the lower face L1 than an upper end of the first internal electrode layer 12a (upper end on the side of the upper face U1). That is, the first internal electrode layers 12a extend further toward the upper face U1 than the second internal electrode layer 12b extend toward the upper face U1. In the structure, the mark 14 provided on the upper face U1 is not provided in the same layer as the first internal electrode layer 12a. Thus, even if water intrudes from the mark 14 in a humidity resistance test, it is possible to suppress occurrence of defect caused by the water.

Figure 5:
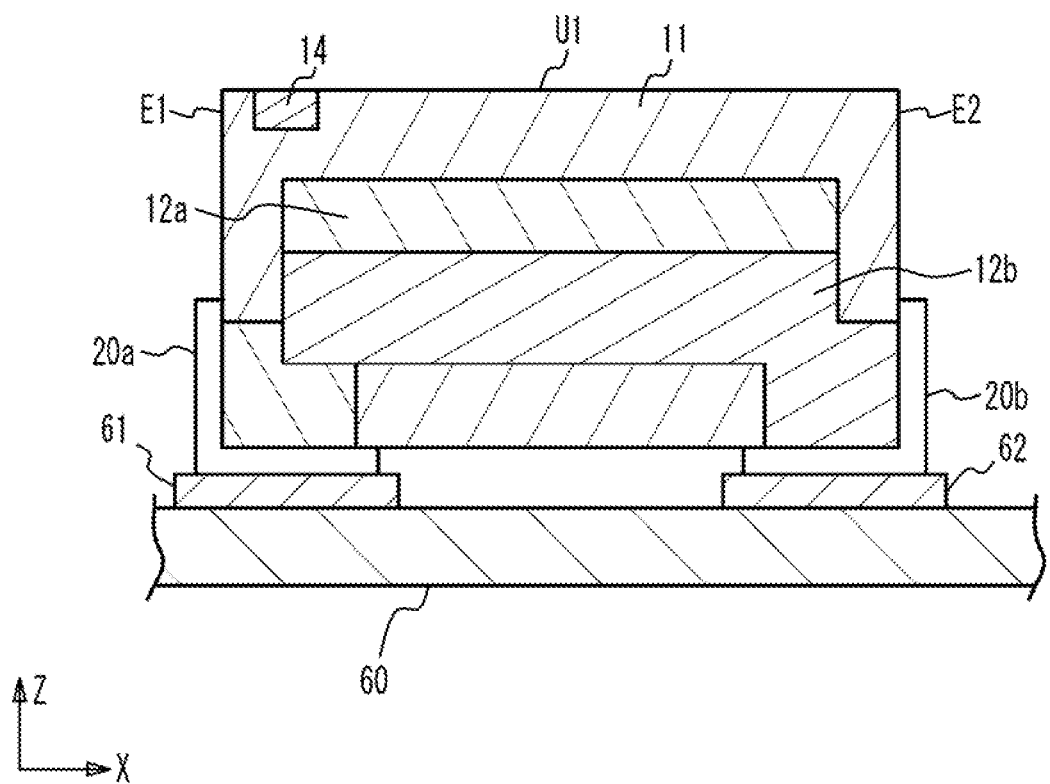
FIG. 5 illustrates a component mounting circuit substrate.

For example, as illustrated in FIG. 5, when the second internal electrode layer 12b having a narrower width in the Z-axis direction faces with apart of the first internal electrode layer 12a having a wider width in the Z-axis direction, in the mounting face side (lower face L1 side) and the first internal electrode layer 12a having the wider width in the Z-axis direction is connected to a ground electrode 61 on a substrate 60, the first internal electrode layer 12a has shield effect. Therefore, the influence of outer noise is suppressed. The second internal electrode layer 12b is connected to a signal electrode 62 on the substrate 60.

Figure 6:
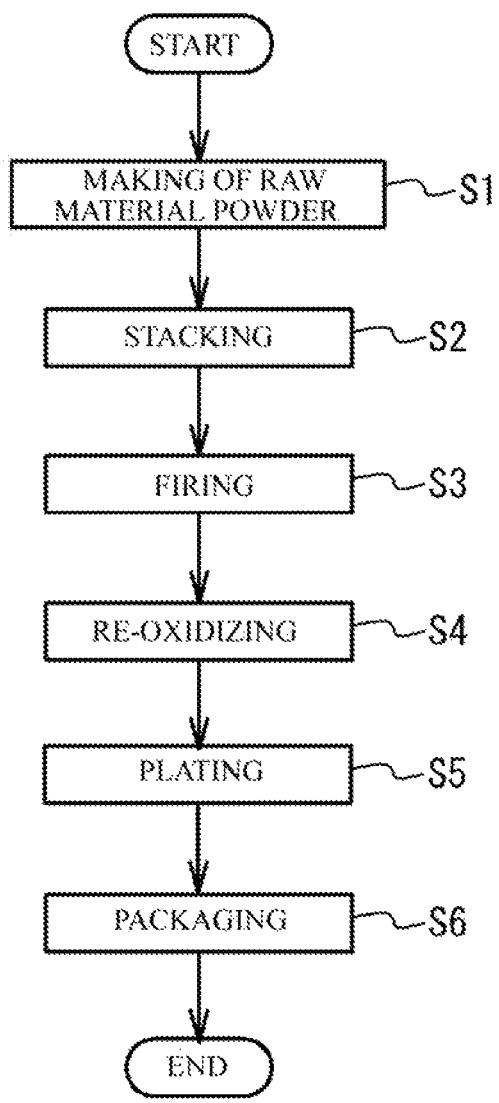
FIG. 6 illustrates a manufacturing method of a multilayer ceramic capacitor.

Next, a description will be given of a manufacturing method of the multilayer ceramic capacitor 100. FIG. 6 illustrates a manufacturing method of the multilayer ceramic capacitor 100.

(Making process of a raw material powder) Additive compound may be added to a ceramic powder material that is the main component of the dielectric layers 11, in accordance with purposes. The additive compound may be an oxide of Mg (magnesium), Mn (manganese), V (vanadium), Cr (chromium) or a rare earth element (Y (yttrium), Sm (samarium), Eu (europium), Gd (gadolinium), Tb (terbium), Dy (dysprosium), Ho (holmium), Er (erbium), Tm (thulium) and Yb (ytterbium)), or an oxide of Co (cobalt), Ni, Li (lithium), B, Na (sodium), K (potassium) and Si, or glass. Compound including additive compound is mixed with the ceramic material powders. The resulting ceramic powders are calcined. Then, the ceramic powders are wet-blended with the additive compound. After that, the ceramic powders with the additive compound are dried and crushed. And, desirable ceramic powder is prepared.

(Stacking Process) Next, a binder such as polyvinyl butyral (PVB) resin, an organic solvent such as ethanol or toluene, and a plasticizer are added to the resulting ceramic material and are wet-blended. With use of the resulting slurry, a strip-shaped dielectric green sheet with a thickness of 2 µm to 16 µm is coated on a base material by, for example, a die coater method or a doctor blade method, and then dried.

Figure 7:
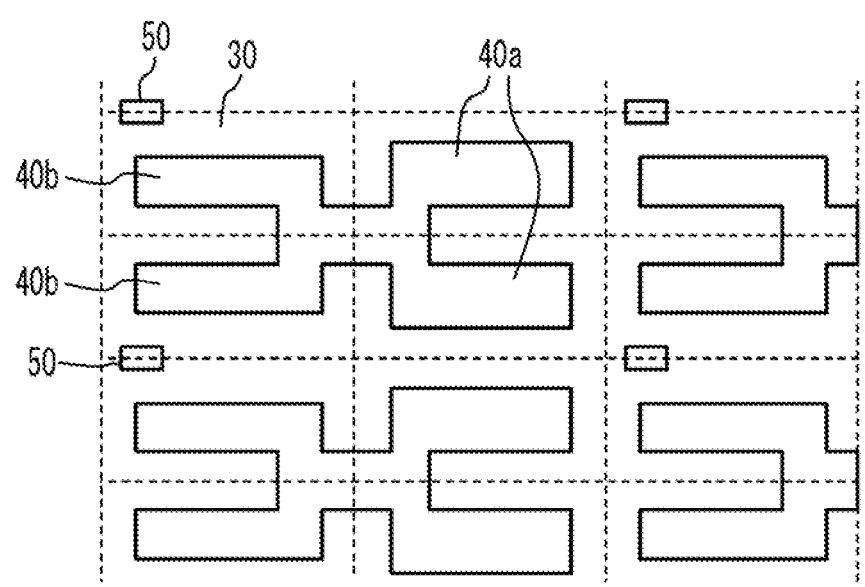
FIG. 7 illustrates a print pattern.

Then, as illustrated in FIG. 7, a first pattern 40a of the first internal electrode layer 12a, a second pattern 40b of the second internal electrode layer 12b, and a pattern 50 of the mark 14 are provided on a surface of a dielectric green sheet 30 by printing conductive paste with use of screen printing or gravure printing. The conductive paste includes powder of a main component metal of the first internal electrode layers 12a and the second internal electrode layer 12b, a binder, an solvent and additives if necessary. It is preferable that the binder and the solvent are different from those of the ceramic slurry. The ceramic material that is the main component of the dielectric layers 11 and acts as the co-material may be dispersed into the conductive paste. When the material of the mark 14 is different from the material of the first internal electrode layer 12a and the second internal electrode layer 12b, the printing of the first pattern 40a and the second pattern 40b and the printing of the pattern 50 are separately performed.

Then, the dielectric green sheet on which the internal electrode layer pattern is printed is stamped into a predetermined size, and a predetermined number (for example, 3 to 30) of stamped dielectric green sheets 30 are stacked while the base material is peeled so that the first pattern 40a and the second pattern 40b are alternated with each other. Cover sheets, which are to be the cover layers 13, are stacked on the stacked dielectric green sheets and under the stacked dielectric green sheets and are crimped. The resulting compact is cut into a predetermined size (for example, 0.4 mm×0.2 mm). Thus, a ceramic multilayer structure having a rectangular parallelepiped shape is formed.

Next, the binder is removed from the ceramic multilayer structure obtained in the stacking process in N2 atmosphere of 200 degrees C. to 500 degrees C. After that, metal conductive paste including a metal filler, a co-material, a binder and a solvent is coated on regions on which the first external electrode 20a and the second external electrode 20b are to be formed, and is dried. The metal paste is used for forming the external electrodes.

(Firing Process) The resulting ceramic multilayer structure is fired for 10 minutes to 2 hours in a reductive atmosphere in a temperature range of 800 degrees C. to 1300 degrees C. Thus, the multilayer chip 10 in which ground layers of the first external electrode 20a and the second external electrode 20b are formed is obtained.

(Plating process) After that, with a plating process, one or more plated layers are formed on the ground layers. With the processes, the multilayer ceramic capacitor 100 is fabricated.

Figure 8A:
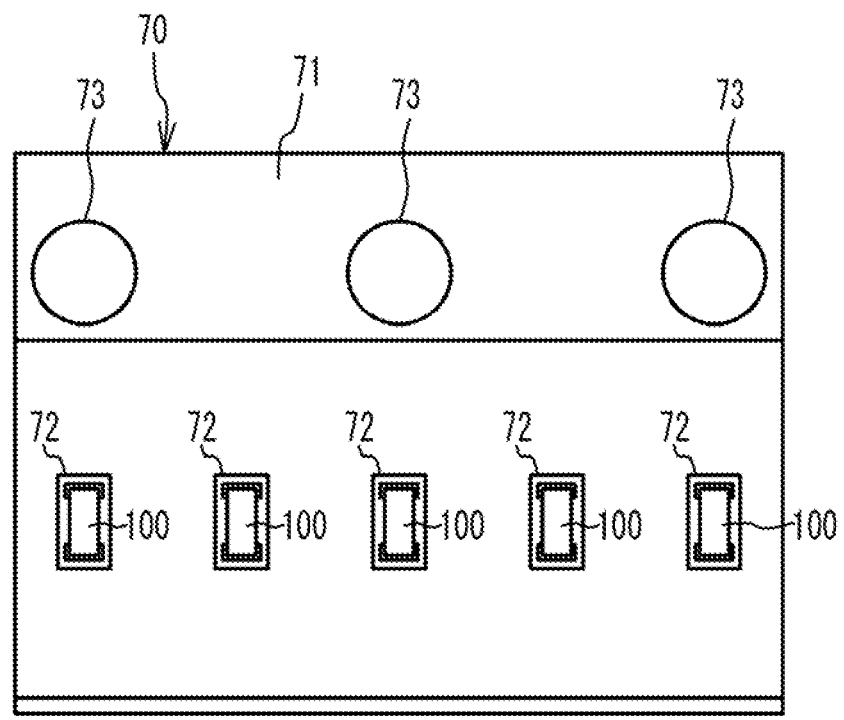
FIG. 8A and FIG. 8B illustrate a package.
Figure 8B:
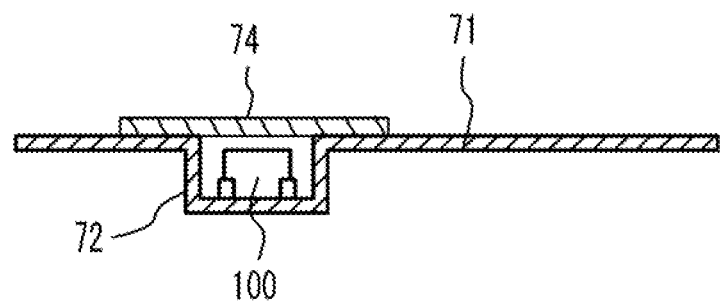

(Packaging process) Next, each of the multilayer ceramic capacitors 100 is packaged in a carrier tape. FIG. 8A illustrates a package body in which each of the multilayer ceramic capacitors 100 is packaged in a carrier tape 70. As illustrated in FIG. 8A, the carrier tape 70 is a type of emboss processing. The carrier tape 70 has a strip-shaped tape main body 71, housing parts 72 provided in the tape main body 71 in a predetermined interval, and sprocket holes 73 having a circle shape. The housing parts 72 have a rectangular parallelepiped shape that is capable of housing the multilayer ceramic capacitor 100. As illustrated in FIG. 8B, each of the multilayer ceramic capacitors 100 is sealed by the housing part 72 and a sealing tape 74. In the manufacturing method of the embodiment, when each of the multilayer ceramic capacitors 100 is housed in the carrier tape 70, it is possible to align the marks 14 in the housing part 72 so that the marks 14 are shifted to one of sides of the housing part 72 by confirming the positions of the marks 14. It is therefore possible to easily mount the multilayer ceramic capacitors 100 in a desirable direction in the mounting.

Figure 9A:
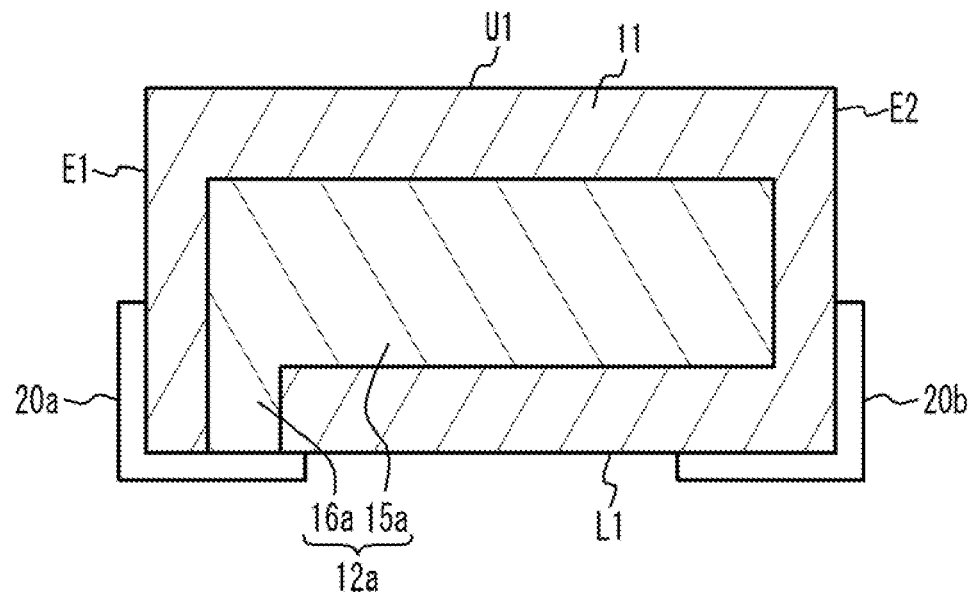
FIG. 9A and FIG. 9B illustrate a first modified embodiment.
Figure 9B:
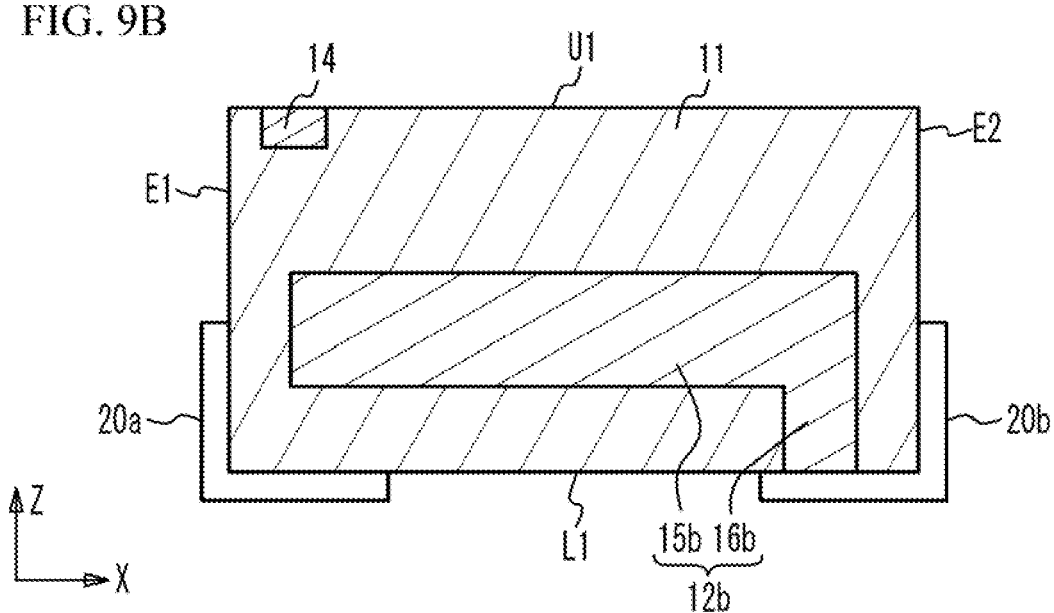

(First modified embodiment) In the above-mentioned embodiment, the internal electrode layers are exposed to one of the first end face and the second end face of the multilayer chip 10. However, the structure it not limited. For example, as illustrated in FIG. 9A, the first internal electrode layers 12a may be exposed to the area of the lower face L1 on the side of the first end face E1, without exposed to the first end face E1. As illustrated in FIG. 9B, the second internal electrode layers 12b may be exposed to the area of the lower face L1 on the side of the second end face E2 without being exposed to the second end face E2. The first modified embodiment may be applied to other modified embodiments.

Figure 10:
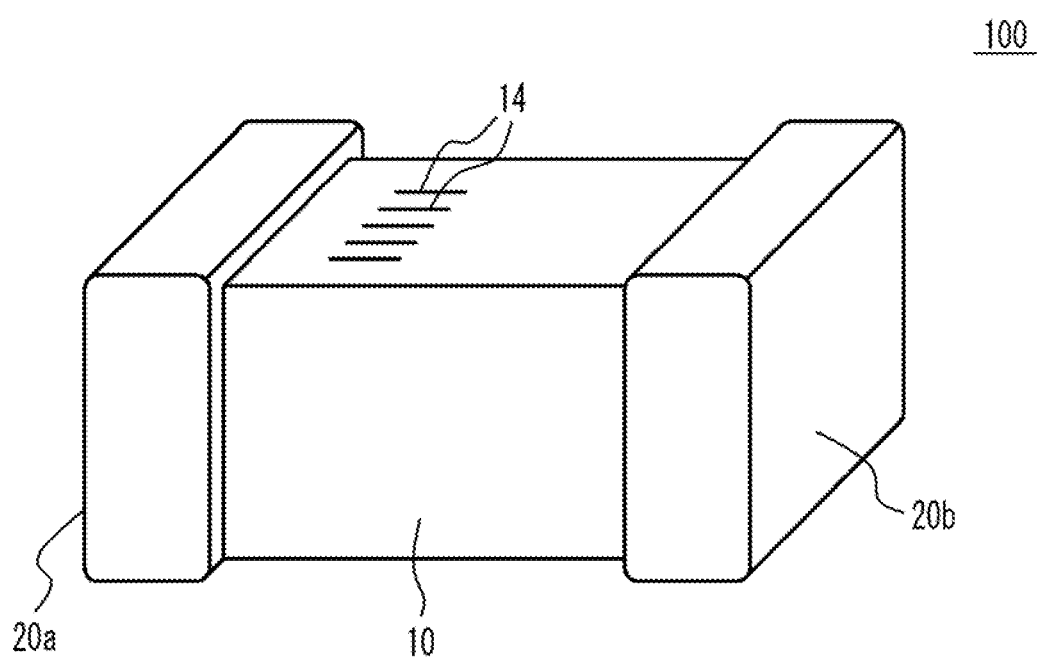
FIG. 10 illustrates a second modified embodiment.

(Second modified embodiment) In the above-mentioned embodiment, each external electrode covers a part of each end face of the multilayer chip 10. However, the structure is not limited. As illustrated in FIG. 10, the first external electrode 20a may cover the whole of the first end face E1 of the multilayer chip 10, and the second external electrode 20b may cover the whole of the second end face E2 of the multilayer chip 10. The second modified embodiment may be applied to other modified embodiments.

Figure 11A:
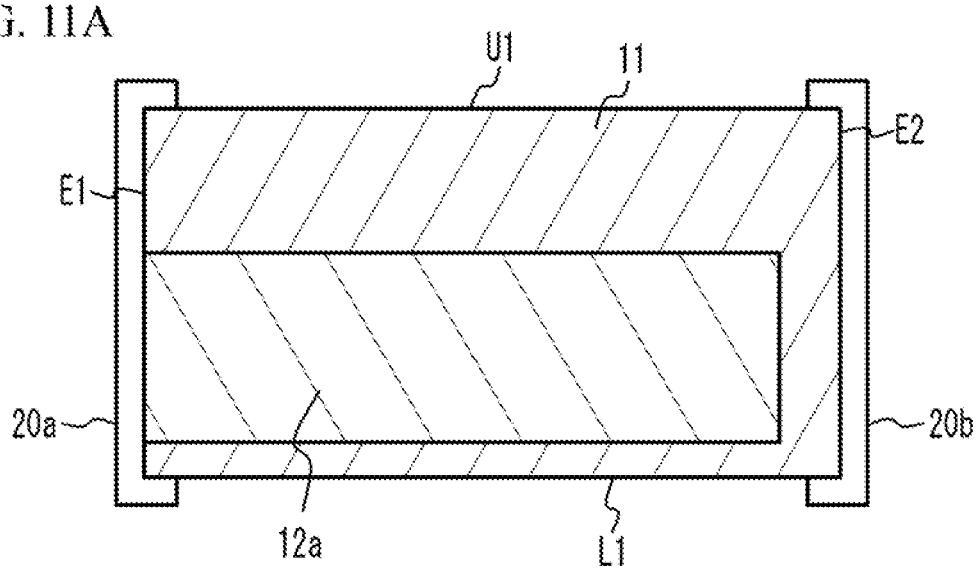
FIG. 11A and FIG. 11B illustrate a third modified embodiment.
Figure 11B:
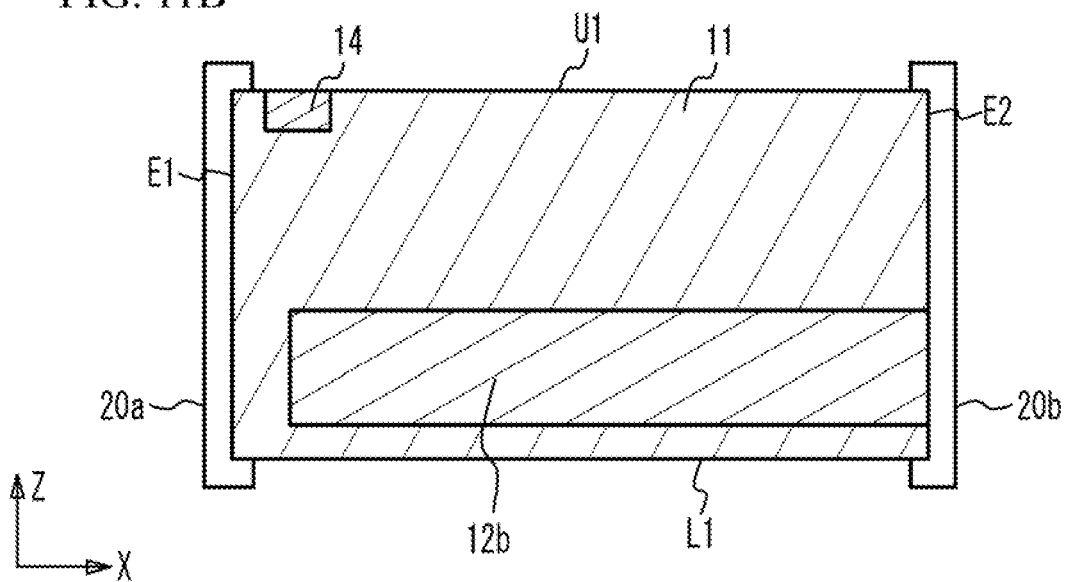

(Third modified embodiment) In the above-mentioned embodiment, the internal electrode layers are exposed to the end face and the lower face L1. However, the internal electrodes may be exposed to only the end face. For example, as illustrated in FIG. 11A, the first internal electrode layers 12a may be exposed to only the first end face E1 of the multilayer chip 10. As illustrated in FIG. 11B, the second internal electrode layers 12b may be exposed to only the second end face E2 of the multilayer chip 10. In the Z-axis direction, the width of the first internal electrode layers 12a may be different from the width of the second internal electrode layers 12b. In the third modified embodiment, the second internal electrode layers 12b are not provided on an upper half of the multilayer chip 10 on the side of the upper face U1 but is provided on a lower half of the multilayer chip 10 on the side of the lower face L1 in the Z-axis direction.

The structure in which the second internal electrode layers 12b are not provided on the upper half of the multilayer chip 10 on the side of the upper face U1 but is provided on the lower half of the multilayer chip 10 on the side of the lower face L1 in the Z-axis direction may be applied to the above-mentioned embodiment and other modified embodiments.

Although the embodiments of the present invention have been described in detail, it is to be understood that the various change, substitutions, and alterations could be made hereto without departing from the spirit and scope of the invention.

What is claimed is:

1. A multilayer ceramic capacitor comprising:
   a multilayer chip that has a rectangular parallelepiped shape and has two end faces facing with each other, an upper face and a lower face facing with each other, and two side faces facing with each other;
   a first external electrode that covers a first region of a surface of the multilayer chip; and
   a second external electrode that covers a second region of the surface of the multilayer chip, the second region being different from the first region,
   wherein the multilayer chip has a first internal electrode layer and a second internal electrode layer that face with each other and sandwich a dielectric layer of which a main component is ceramic,
   wherein the multilayer chip has a mark that is shifted on a side of one of the two end faces on the upper face and has a color different from that of the dielectric layer,
   wherein the first internal electrode layer is exposed to the first region and is connected to the first external electrode,
   wherein the second internal electrode layer is exposed to the second region and is connected to the second external electrode,
   wherein the second internal electrode is shifted further on a side of the lower face than on a side of the upper face,
   wherein the second region is a region of a half of the surface of the multilayer chip on the lower face side, in a facing direction of the upper face and the lower face.

2. The multilayer ceramic capacitor as claimed in claim 1, wherein the first internal electrode layer extends further toward the upper face than the second internal electrode layer extend toward the upper face.

3. The multilayer ceramic capacitor as claimed in claim 1, wherein the mark is not provided in a plane formed by the first internal electrode layer but is provided in a plane formed by the second internal electrode layer.

4. The multilayer ceramic capacitor as claimed in claim 1, wherein the first region extends from one of the two end faces to the lower face,
   wherein the second region extends from the other of the two end faces to the lower face.

5. The multilayer ceramic capacitor as claimed in claim 1, wherein the second internal electrode layer is not provided on a region of a half of the multilayer chip on the side of the upper face, but is provided on a region of a half of the multilayer chip on the side of the lower face, in a facing direction of the upper face and the lower face.

6. A package of a multilayer ceramic capacitor comprising:
   a plurality of multilayer ceramic capacitors as claimed in claim 1; and
   a carrier tape that has a plurality of housing parts for housing the plurality of multilayer ceramic capacitors,
   wherein each of the plurality of multilayer ceramic capacitors is housed in each of the plurality of housing parts so that the marks of the plurality of multilayer ceramic capacitor are shifted to one of sides of the each of the housing parts.

7. A component mounting circuit substrate comprising:
   a substrate having a ground electrode and a signal electrode that are provided on a face thereof; and
   a multilayer ceramic capacitor as claimed in claim 1,
   wherein the first external electrode is connected to the ground electrode,
   wherein the second external electrode is connected to the signal electrode.

* * * * *